United States Patent
Rivero et al.

(10) Patent No.: US 11,075,246 B2
(45) Date of Patent: Jul. 27, 2021

(54) METHOD FOR GENERATION OF ELECTRICAL POWER WITHIN A THREE-DIMENSIONAL INTEGRATED STRUCTURE AND CORRESPONDING LINK DEVICE

(71) Applicant: STMicroelectronics (Rousset) SAS, Rousset (FR)

(72) Inventors: Christian Rivero, Rousset (FR); Pascal Fornara, Pourrières (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 391 days.

(21) Appl. No.: 15/818,496

(22) Filed: Nov. 20, 2017

(65) Prior Publication Data

US 2018/0090541 A1 Mar. 29, 2018

Related U.S. Application Data

(62) Division of application No. 14/232,606, filed as application No. PCT/EP2012/063129 on Jul. 5, 2012, now Pat. No. 9,847,373.

(30) Foreign Application Priority Data

Jul. 13, 2011 (FR) ...................................... 1156420

(51) Int. Cl.
*H01L 27/16* (2006.01)
*H01L 35/32* (2006.01)

(52) U.S. Cl.
CPC .............. *H01L 27/16* (2013.01); *H01L 35/32* (2013.01); *H01L 35/325* (2013.01); *H01L 2224/16225* (2013.01); *H01L 2924/15311* (2013.01)

(58) Field of Classification Search
CPC ....... H01L 27/16; H01L 35/32; H01L 35/325; H01L 2924/15311; H01L 2224/16225
See application file for complete search history.

(56) References Cited

U.S. PATENT DOCUMENTS 6,598,405 B2   7/2003   Bell
6,800,933 B1 * 10/2004   Mathews ................ H01L 23/38
                                                    257/467

(Continued)

FOREIGN PATENT DOCUMENTS

CN          1773740 A      5/2006
CN          1890803 A      1/2007

(Continued)

OTHER PUBLICATIONS

Carmo, J. et al., "A Planar Thermoelectric Power Generator for Integration in Wearable Microsystems," Sensors and Actuators A: Physical, 161, May 26, 2010, 6 pp.

(Continued)

*Primary Examiner* — Golam Mowla
(74) *Attorney, Agent, or Firm* — Slater Matsil, LLP

(57) ABSTRACT

Method for generation of electrical power within a three-dimensional integrated structure comprising several elements electrically intercoupled by a link device, the method comprising the production of a temperature gradient in at least one region of the link device resulting from the operation of at least one of the said elements and the production of electrical power using at least one thermoelectric generator comprising at least one assembly of thermocouples electrically coupled in series and thermally coupled in parallel and contained within the said region subjected to the said temperature gradient.

20 Claims, 10 Drawing Sheets

(56) References Cited

U.S. PATENT DOCUMENTS

| | | | |
|---|---|---|---|
| 7,034,394 | B2 | 4/2006 | Ramanathan et al. |
| 7,544,883 | B2 | 6/2009 | Chen et al. |
| 8,552,617 | B2 | 10/2013 | Lim |
| 8,604,867 | B2 | 12/2013 | Sanchez |
| 8,941,205 | B2 | 1/2015 | Rivero et al. |
| 2002/0092557 | A1* | 7/2002 | Ghoshal ............ H01L 35/30 136/201 |
| 2005/0077619 | A1 | 4/2005 | Ramanathan et al. |
| 2006/0102223 | A1 | 5/2006 | Chen et al. |
| 2009/0000652 | A1 | 1/2009 | Von Windheim et al. |
| 2009/0120482 | A1 | 5/2009 | McCullough et al. |
| 2010/0219525 | A1 | 9/2010 | Ibaraki |
| 2010/0308898 | A1 | 12/2010 | Rivero et al. |
| 2011/0128727 | A1 | 6/2011 | Kochupurackal et al. |
| 2012/0291425 | A1 | 11/2012 | Mitchell et al. |
| 2013/0026597 | A1 | 1/2013 | Rivero et al. |

FOREIGN PATENT DOCUMENTS

| | | |
|---|---|---|
| CN | 101908848 A | 12/2010 |
| EP | 1443568 A2 | 8/2004 |
| FR | 2946460 A1 | 12/2010 |
| JP | 2005259810 A | 9/2005 |
| WO | 0247178 A2 | 6/2002 |
| WO | 2010010520 A2 | 1/2010 |

OTHER PUBLICATIONS

Huesgen, T. et al., "Design and Fabrication of MEMS Thermoelectric Generators with High Temperature Efficiency," ScienceDirect, www.sciencedirect.com, Sensors and Actuators A, 145-146, 2008, 423-429, Jun. 28, 2007.

Ismail, B.I., et al., "Thermoelectric Power Generation Using Waste-Heat Energy as an Alternative Green Technology," Recent Patents on Electrical Engineering 2009, Revised Nov. 24, 2008, pp. 27-39.

Kao, P. et al., "Fabrication and Characterization of CMOS-MEMS Thermoelectric Micro Generators," Sensors, 10, 1315-1325; doi 10.3390/s 100201315; www.mdpi.com/journal/sensors, Feb. 9, 2010, 11 pp.

Koester, D. et al., "Embedded Thermoelectric Coolers for Semiconductor Hot Spot Cooling," IEEE, May 30, 2006-Jun. 2, 2006, 6 pp.

Lhermet, H. et al., "Efficient Power Management Circuit: From Thermal Energy Harvesting to Above-IC Microbattery Energy Storage," IEEE Journal of Solid-State Circuits, vol. 43, No. 1, Jan. 2008, 10 pp.

Mateu, L., et al., "Review of Energy Harvesting Techniques and Applications for Microelectronics," Proc. SPIE 5837, VLSI Circuits and Systems II, 359, Jun. 30, 2005, 15 pp.

Ohta, H. et al., "Critical Thickness for Giant Thermoelectric Seebeck Coefficient of 2DEG Confined in SrTiO3/SrTi0.8Nb0.2O3 Superlattices," ScienceDirect, Thin Solid Films 516, www.sciencedirect.com, Oct. 13, 2007, 5 pp.

Vullers, R. et al., "Micropower Energy Harvesting," www.elsevier.com/locate/sse, Solid State Electronics, 53, Apr. 25, 2009, 10 pp.

Wang, Z. et al., "Realization of a Wearable Miniaturized Thermoelectric Generator for Human Body Applications," Sensors and Actuators A: Physical, 156, www.elsevier.com/locate/sna, Mar. 2009, 8 pp.

Yang, S. et al., "Development of a Thermoelectric Energy Harvester with Thermal Isolation Cavity by Standard CMOS Process," Jun. 17, 2009, 7 pp.

Yang, S. et al., "Design and Verification of a Thermoelectric Energy Harvester with Stacked Polysilicon Thermocouples by CMOS Process," Sensors and Actuators A: Physical, 157, Dec. 2009, 9 pp.

\* cited by examiner

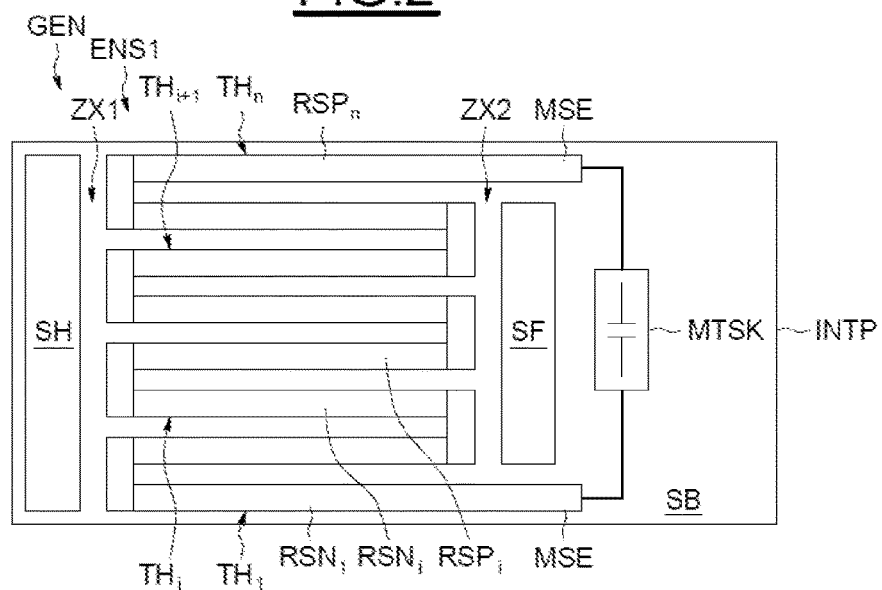
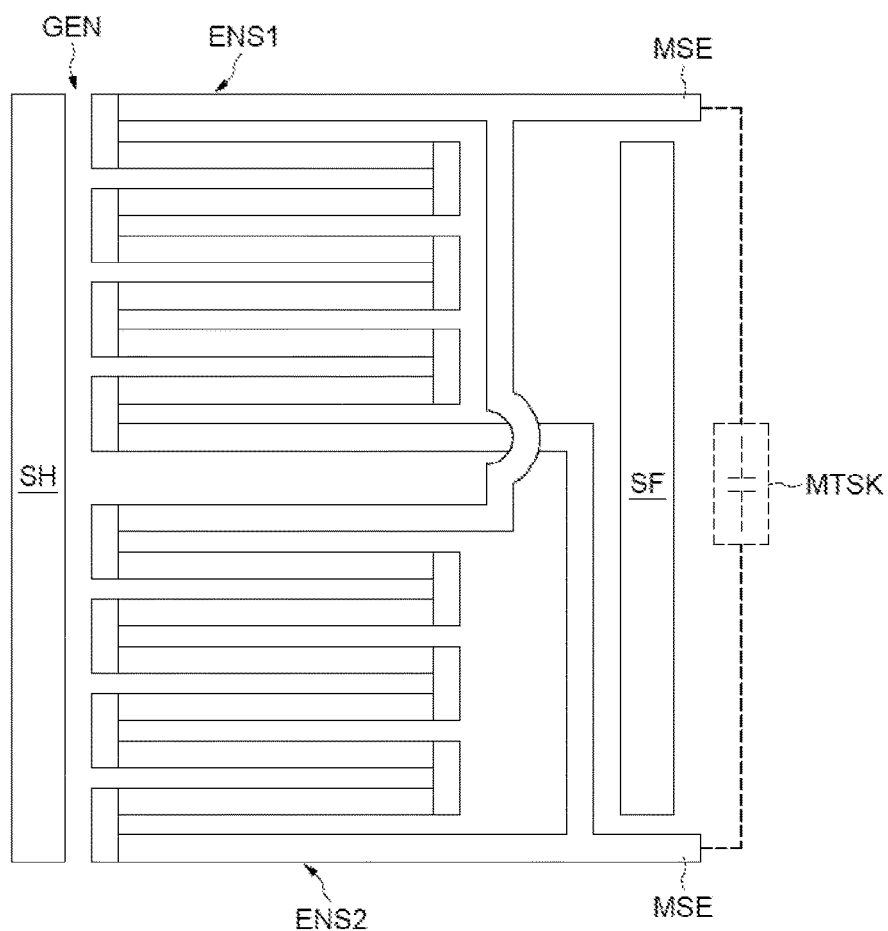

METHOD FOR GENERATION OF ELECTRICAL POWER WITHIN A THREE-DIMENSIONAL INTEGRATED STRUCTURE AND CORRESPONDING LINK DEVICE

CROSS-REFERENCE TO RELATED APPLICATIONS

This patent application is a divisional of U.S. patent application Ser. No. 14/232,606, filed Apr. 17, 2014, which is a national phase filing under section 371 of PCT/EP2012/063129, filed Jul. 5, 2012, which claims the priority of French patent application No. 1156420, filed Jul. 13, 2011. Each of these Applications is incorporated herein by reference in its entirety.

TECHNICAL FIELD

The invention relates to microelectronics, notably three-dimensional technological platforms, and more particularly the generation of electrical power within an integrated structure other than that produced by a conventional power supply such as for example a battery.

BACKGROUND

A three-dimensional integrated structure comprises for example several elements (at least two) electrically interconnected by a link device, generally known by those skilled in the art as an "interposer." Generally speaking, the interposer comprises for example a silicon substrate on which metal tracks can be formed running over at least one metallization level and/or be equipped with vias traversing the substrate, commonly denoted by those skilled in the art using the acronym TSV (for Through Silicon Via), so as to provide the interconnection between various elements that can be disposed on the same face or on different faces of the interposer.

Thus, two elements, such as integrated circuits can be connected on the same first face of the interposer by means of beads or "bumps," while being electrically interconnected or not, and another element, for example a printed circuit board (or PCB), or else another integrated circuit, can be electrically connected to the other face of the interposer also by means of bumps.

SUMMARY OF THE INVENTION

According to one embodiment and its implementation, the idea is thus to recover electrical power using the operation specific to the integrated structure, and then to potentially store this electrical power so as to be able, for example, to supply power to a specific part of an integrated circuit of the structure and/or to recharge a battery. It then becomes possible to considerably increase the lifetime of the battery and/or to reduce the size of the latter.

For this purpose, the idea is, in particular, to use the available space in the interposer of the structure to accommodate a thermo-electric generator that will allow this electrical power to be generated.

Indeed, when the interposer comprises a semiconductor substrate and, on top of the substrate, an electrically-conducting interconnection part buried in an insulating coating, commonly denoted by those skilled in the art by the acronym BEOL ("Back End Of Line") and being used for the interconnection between various elements of the integrated structure with the metal tracks contained in this interconnection part (BEOL), it is particularly straightforward for at least a part of the thermocouples, in particular N and P pairs of bars, to be buried within the insulating coating between the said interconnection part and the semiconductor substrate.

The electrical links between the various thermocouples can then be readily formed on at least one metallization level of the interconnection part.

A thermo-electric generator accommodated within the interposer is advantageously, but is not limited to, a generator fabricated using CMOS technology and, in particular, is totally compatible with fabrication technologies already widely employed in the field of the microelectronics, in particular for the fabrication of onboard non-volatile memories, or Embedded Memories according to the terminology well known to those skilled in the art, in other words memories that are fabricated on the same integrated circuit as those containing another component, for example a processor, as opposed to the external memory modules which are fabricated on an external specific integrated circuit being different from that containing a processor.

In particular, use is made of layers of material, for example of polysilicon, already available, in order to form the memory-cells and without the generator requiring any additional masks or additional process steps with respect to the fabrication processes for existing memory-cells.

As a variant, use is made of a generator whose fabrication process, while being integrated into a conventional fabrication process for memory-cells, nevertheless requires the inclusion of some additional process steps that are particularly simple to implement.

According to one aspect, a method for generation of electrical power within a three-dimensional integrated structure is provided comprising several elements electrically interconnected by a link device, the method comprising the production of a temperature gradient within at least one region of the link device resulting from the operation of at least one of the said elements, and the production of electrical power using at least one thermo-electric generator comprising at least one assembly of thermocouples electrically connected in series and thermally connected in parallel and contained within the said region subjected to the said temperature gradient.

According to another aspect, a link device is provided for the interconnection of several elements of a three-dimensional integrated structure, furthermore comprising at least one thermo-electric generator comprising at least one assembly of thermocouples electrically connected in series and thermally connected in parallel.

According to one advantageous embodiment, compatible notably with technologies for fabrication of embedded non-volatile memories, the link device comprises a semiconductor substrate, for example made of silicon, and insulating regions, for example, shallow trenches known by those skilled in the art as STI (Shallow Trench Isolation). The at least one assembly of thermocouples comprises parallel semiconductor regions, for example, regions of N or P doped polysilicon, each having one type of conductivity taken from between two opposing types of conductivity. At least some of these parallel semiconductor regions can run in the substrate between parallel insulating regions. Alternatively, at least some of these parallel semiconductor regions can run over and above a part of the substrate while being electrically isolated from the said substrate part, and on top of at least a part of the insulating regions. Alternatively, at least some of these parallel semiconductor regions are coated with an insulating material and can run in their entirety on top of parallel insulating regions, or in their entirety on top of the substrate regions situated between the said parallel insulating regions.

Whatever the configuration, the said semiconductor regions are electrically connected in series so as to form a chain of regions having alternately one and the other of the two types of conductivity.

According to one embodiment, the generator also comprises electrically-conducting connection means providing the electrical link between the semiconductor regions, these connection means being situated on top of the substrate and connecting one end area of a semiconductor region having one of the two types of conductivity, for example the N type of conductivity, to an end area of a semiconductor region having the other type of conductivity, for example the P type of conductivity.

For example, the connection means are coated with an insulating material and comprise metal tracks parallel to the semiconductor regions connected to the said end areas by vertical electrical links, known by those skilled in the art as "vias" or "contacts."

Several structures are possible for the formation of the assembly of thermocouples.

It is also possible for the generator to comprise at least one other assembly of thermocouples electrically connected in series and thermally connected in parallel, all the assemblies being mutually electrically and thermally connected in parallel.

According to another aspect, a three-dimensional integrated structure is also provided that comprises at least two elements electrically interconnected by a link device such as defined hereinabove, whose thermo-electric generator is thermally coupled with at least one of the said elements in such a manner that the said at least one of the said elements is capable, in operation, of generating a temperature gradient between the corresponding first end areas and the corresponding second end areas of all the thermocouples, the link device furthermore comprising electrically-conducting output means coupled to the said generator in order to deliver the electrical power produced by the said generator.

It is also possible for the integrated structure to comprise means for storing electrical power, electrically coupled to the electrically-conducting output means.

According to one embodiment, the link device comprises at least one metallization level on top of a semiconductor substrate and at least a part of the electrical links between the thermocouples comprises metal tracks running over at least one metallization level.

BRIEF DESCRIPTION OF THE DRAWINGS

Other advantages and features of the invention will become apparent upon examining the detailed description of non-limiting embodiments and the appended drawings, in which:

FIGS. 2 and 3 illustrate schematically examples of generators that may be supported by and/or incorporated into a link device according to the invention.

DETAILED DESCRIPTION OF ILLUSTRATIVE EMBODIMENTS

Figure 1:
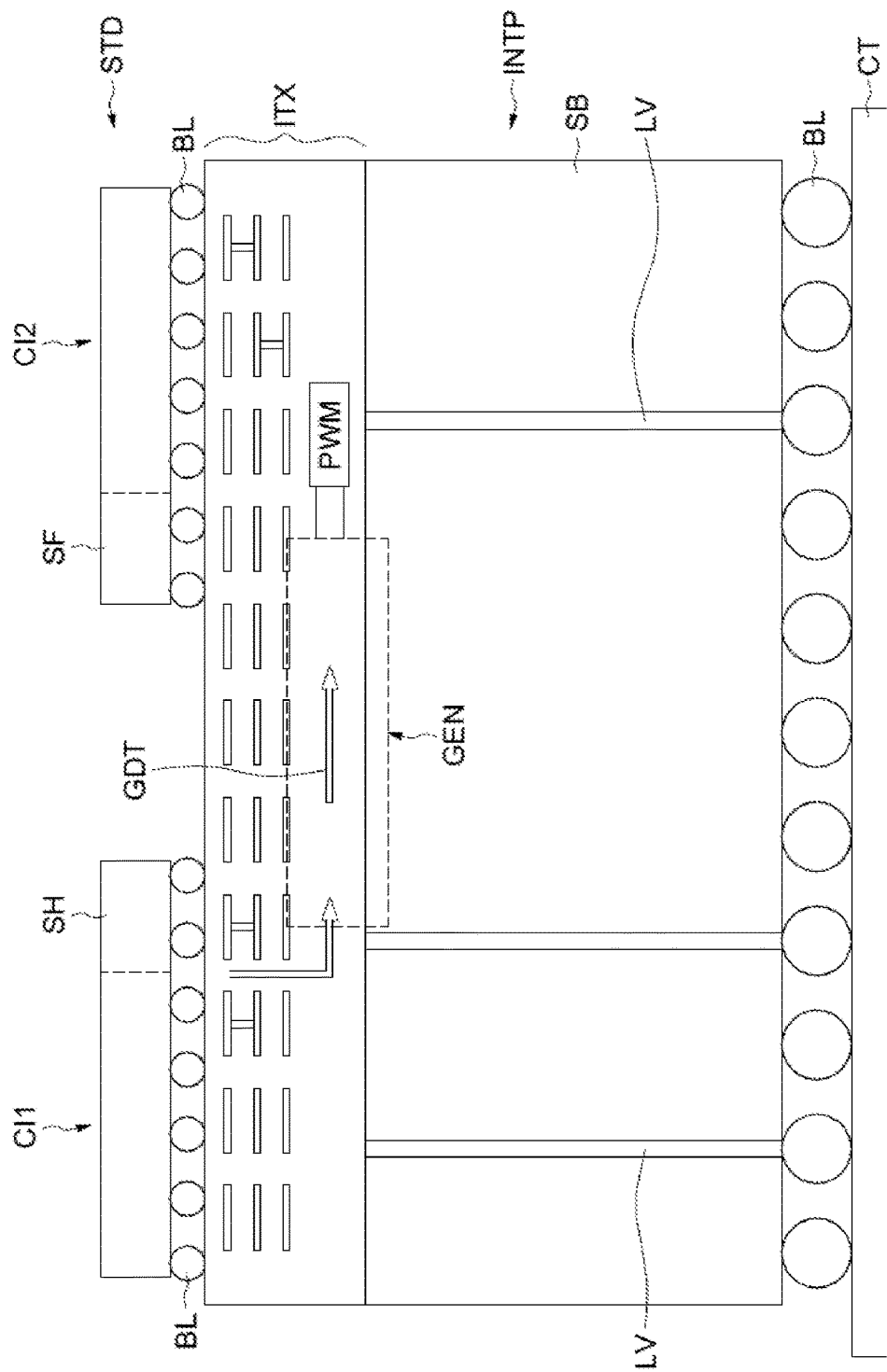
FIG. 1 illustrates schematically one implementation of a method according to the invention within one embodiment of a link device or interposer of one example of integrated structure according to the invention incorporating one example of thermo-electric generator.

In FIG. 1, the reference STD denotes a three-dimensional integrated structure, comprising a link device or interposer INTP on the upper face of which are connected in this example two integrated circuits CI1 and CI2, for example, by connection beads or "bumps" BL.

Furthermore, the integrated structure STD also comprises a third element, namely in this case an integrated circuit board or PCB (Printed Circuit Board) onto which is connected the lower face of the interposer INTP also by means of bumps BL.

The interposer INTP comprises a substrate SB, generally made of silicon, together with an interconnection part INTX comprising several metallization levels, within which metal tracks are formed, being connected together for some of them through vias. The whole assembly of metal tracks and of vias is coated with an insulating coating, for example, of silicon dioxide, and, in particular, provides the electrical interconnection between the two integrated circuits CI1 and CI2.

The substrate SB also comprises electrically-conducting vertical links LV, in the form of TSVs ("Through Silicon Vias") allowing, for example, some of the metal tracks of the interconnection part ITX to be electrically connected with the bumps BL so as to provide a vertical electrical connection between at least one of the integrated circuits CI1 and CI2 and the board CT.

Here, according to one aspect of the invention, the idea is to use the interposer INTP in order to incorporate into it a thermo-electric generator GEN.

Thermo-electric generators conventionally comprise an assembly of thermocouples electrically connected in series and thermally connected in parallel. Thermocouples thermally connected in parallel is understood to mean thermocouples designed to be all subjected to the same temperature gradient, for example when a source of heat is disposed at one of the ends of the thermocouples, and when a cold source is disposed at the other end.

Due to the Seebeck effect, a potential difference is then created across the two terminals of the assembly of thermocouples electrically connected in series.

According to one aspect of the invention, the electrical activity of the various integrated circuits CI1, CI2, connected on the interposer INTP, will generate a temperature gradient GDT to which the generator GEN will be subjected.

Indeed, the integrated circuits do not necessarily exhibit the same activity at the same time. Thus, as illustrated in FIG. 1, one end of the generator GEN is thermally coupled with a part of the integrated circuit CI1 which forms a hot source, whereas the other end of the generator GEN is thermally coupled with a part of the other integrated circuit CI2 which forms a cold source. The operation is of course reversible, in other words the cold source may become, at a given moment, the hot source, and the hot source may become the cold source. In this case, the temperature gradient is reversed together with the direction of the current generated.

It would also be possible, if the structure STD only comprises a single integrated circuit, for example the circuit CI1, to place one end of the generator GEN thermally coupled with this integrated circuit CI1 then forming the hot source SH, whereas the other end of the generator GEN would not be thermally coupled with any integrated circuit, which would then constitute a cold source.

The electrical power delivered across terminals of the generator GEN can then be managed by a power management module PWM which can be a specific component directly fabricated on the interposer, and even better, can be an embedded module, in other words fabricated at the same time as the generator GEN.

This module PWM can directly supply power to a load, or else a battery, or alternatively, storage means such as a capacitor.

Generally speaking, any thermo-electric generator structure is suitable.

The generators described in the following publications may notably be used: the article by Vullers, et al., entitled "Micropower energy harvesting," Solid-State Electronics 53 (2009) 684-693; the article by Yang, et al., entitled "Design and verification of a thermoelectric energy harvester with stacked polysilicon thermocouples by CMOS process," Sensors and actuators A157 (2010) 258-266; the article by Pin-Hsu Kao, et al., entitled "Fabrication and Characterization of CMOS-MEMS Thermoelectric Micro Generators," Sensors 2010, 10, 1315-1325; the article by Joao Paulo Carmo, et al., entitled "A planar thermoelectric power generator for integration in wearable microsystems," Sensors and Actuators A161 (2010), 199-204; the article by S. M. Yang, et al., entitled "Development of a thermoelectric energy harvester with thermal isolation cavity by standard CMOS process," Sensors and Actuators A153 (2009), 244-250; the article by Ziyang Wang, et al., entitled "Realization of a wearable miniaturized thermoelectric generator for human body applications," Sensors and Actuators A156 (2009), 95-102; the article by Helene Lhermet, et al., entitled "Efficient Power Management Circuit: From Thermal Energy Harvesting to Above-IC Microbattery Energy Storage," IEEE Journal of Solid-State Circuits, Vol. 43, No 1, January 2008; the article by Till Huesgen, et al., entitled "Design and fabrication of MEMS thermoelectric generators with high temperature efficiency," Sensors and Actuators A145-146 (2008), 423-429; the article by David Koester, et al., entitled "Embedded thermoelectric coolers for semiconductor hot spot cooling", 2006 IEEE; the article by Hiromichi Ohta, et al., entitled "Critical thickness for giant thermoelectric Seebeck coefficient of 2DEG confined in $SrTiO_3/SrTi_{0.8}Nb_{0.2}O_3$ superlattices," Thin Solid Films 516 (2008), 5916-5920.

However, it is particularly advantageous to use the generators GEN that will now be described with reference to FIG. 2 and the following, because these are compatible with fabrication technologies widely used in microelectronics, notably those used for the fabrication of embedded non-volatile memories.

In FIG. 2, the generator comprises an assembly ENS1 of thermocouples $TH_i$.

Each thermocouple $TH_i$ here comprises a semiconductor region in the form of a bar, of N type of conductivity, referenced $RSN_i$, and a semiconductor region of P type of conductivity, referenced $RSP_i$, also in the form of a bar.

The two semiconductor regions of the thermocouple $TH_i$ are parallel and electrically connected at one of their ends, and all of the thermocouples $TH_i$ are electrically connected in series so as to form a chain of parallel bars having alternately the N type of conductivity and the P type of conductivity.

To the respective and corresponding ends of the bars $RSN_1$ and $RSP_n$ respectively belonging to the first thermocouple $TH_1$ and to the last thermocouple $TH_n$, electrically-conducting output means MSE are connected, for example metal tracks or an extension of the corresponding bars.

The hot source SH and the cold source SF are respectively disposed in front of the corresponding end areas ZX1 of all the parallel semiconductor regions of the thermocouples and of the corresponding end areas ZX2 of these parallel semiconductor regions.

Owing to the Seebeck effect, the PN pairs subjected to the temperature difference or gradient will generate an electrical current which will be delivered by the output means MSE to then, for example, be stored in means for storing electrical power MSTK, comprising for example a capacitor connected to the terminals of the means MSE so as to form a closed electrical circuit.

As a variant, the means MSE can be connected to another part of the integrated circuit so as to also form a closed circuit and to be able to directly supply electrical power to this other part of the integrated circuit.

The output power of the generator GEN mainly depends on the number of PN pairs, on the surface area of the generator, on the value of the temperature gradient, and on the nature of the materials, in other words on their Seebeck coefficient.

The thermocouples of the assembly ENS1 are thermally connected in parallel, in other words they are connected so as to all be subjected together to the same temperature gradient.

As a variant, it is possible, as illustrated in FIG. 3, for the generator to comprise at least one other assembly of thermocouples, here a second assembly of thermocouples ENS2, having a structure identical to or different from that of the first assembly ENS1. Here again, the thermocouples of the other assembly ENS2 are electrically connected in series and thermally connected in parallel.

Furthermore, the two assemblies ENS1, ENS2 are mutually electrically connected in parallel, and are furthermore also mutually thermally connected in parallel, in other words, in the present case, the hot source SH and the cold source SF allow the temperature difference created by the hot and cold sources SH and SF to be applied to all the thermocouples of all the assemblies.

This allows a higher electrical power to be supplied to the electrically-conducting output means MSE.

Several examples of generator structures GEN will now be described with reference to FIGS. 4 to 16.

Figure 4:
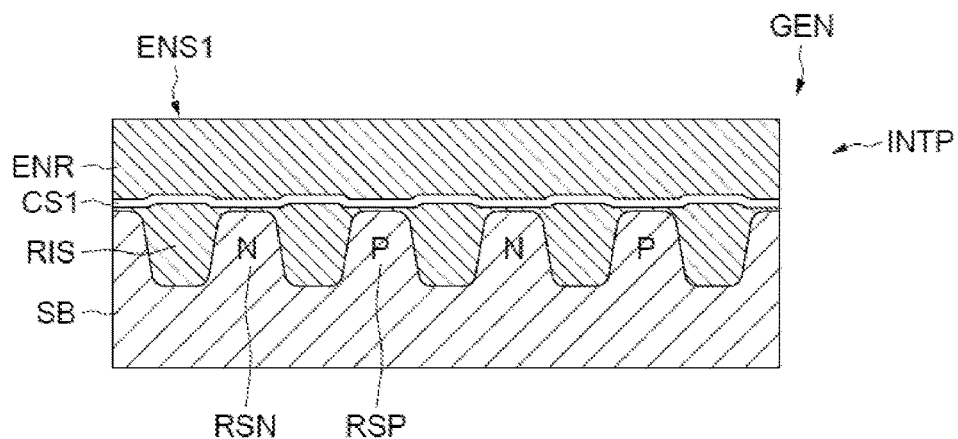
FIGS. 4 to 16 illustrate, in more detail but still in a schematic manner, other examples of generators that may be supported by and/or incorporated into a link device according to the invention.

In FIG. 4, the support for the generator GEN comprises a region of the semiconductor substrate SB of the interposer INTP within which parallel insulating regions RIS are arranged, for example regions of the STI (Shallow Trench Isolation) type.

The assembly of thermocouples ENS1 is situated in the substrate SB and comprises parallel semiconductor regions RSN, RSP running in the substrate, two neighboring semiconductor regions RSN, RSP respectively having one and the other of the two types of conductivity, in this case the N type of conductivity and the P type of conductivity, and which are separated by an insulating region RIS.

The assembly is covered by an insulating layer CS1, for example a layer of silicon nitride, itself covered with an insulating coating, for example of silicon dioxide $SiO_2$.

The fabrication of such a generator is perfectly compatible with the conventional method for fabrication of embedded memories and does not require any modification of the method nor addition of mask level.

The insulating coating ENR is for example that in which the metallization levels of the interconnection part ITX are formed.

For this purpose, and generally speaking, whatever the structure of the thermocouple assembly used, the generator comprises electrically-conducting connection means providing the electrical link between the semiconductor regions of the thermocouples, these connection means being situated on top of the substrate and connecting one end area of a semiconductor region having one of the two types of conductivity, for example the N type of conductivity, to an end area of a semiconductor region having the other type of conductivity, for example, the P type of conductivity.

For example, these connection means are coated with the insulating material ENR and comprise metal tracks parallel to the semiconductor regions and connected to the said end areas by vertical electrical links, for example, contacts or vias.

In addition, so as to be perfectly compatible with conventional methods for component fabrication, for example, embedded memories, the metal tracks of the connection means are situated on at least one of the metallization levels of the interconnection part ITX.

Figure 5:
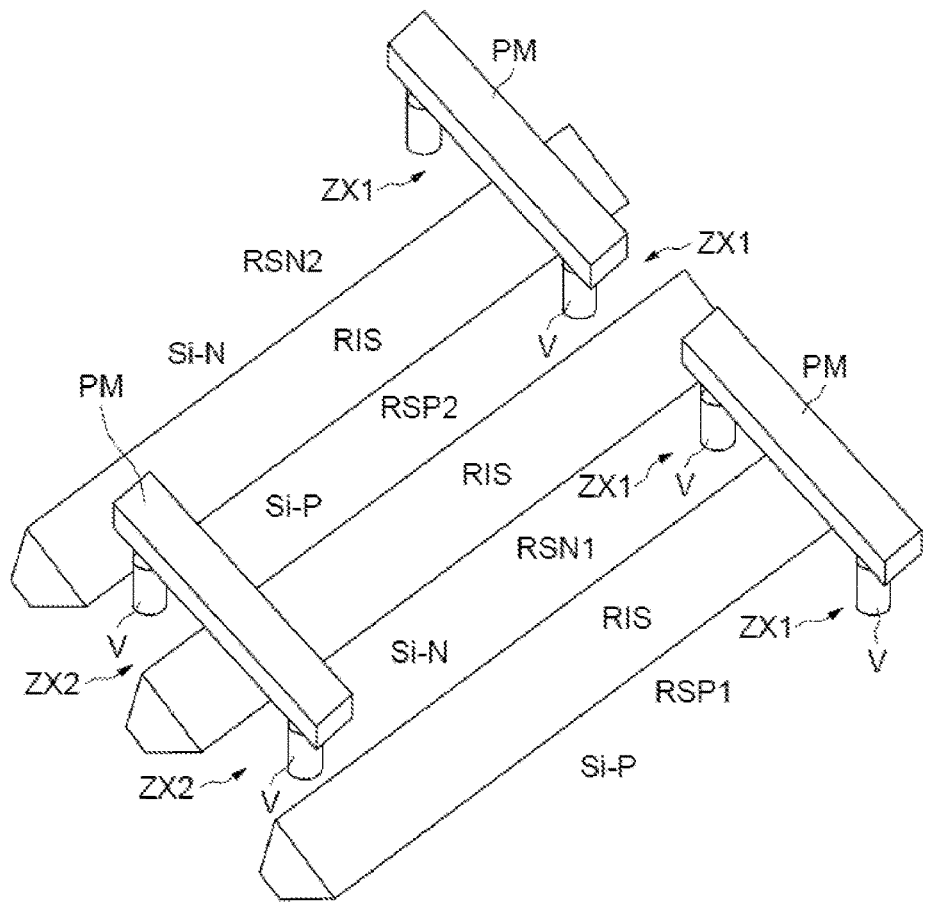

This is more particularly illustrated in FIG. 5, which shows the connection means of the generator in FIG. 4.

Thus, the end area ZX1 of the semiconductor region RSN is electrically connected to the corresponding end area ZX1 of the region $RSP_1$ by a metal track PM straddling the insulating region RIS separating these two regions RSN1 and RST1, this metal track being connected to the end areas ZX1 through vias V.

Similarly, the end areas ZX2 of the regions RSN1 and RSP2 are also connected together by a metal track PM straddling the region RIS separating these two regions RSN1 and RSP2. This metal track PM is connected to the end areas ZX2 through vias V.

Similarly, the two end areas ZX1 of the regions RSP2 and RSN2 are connected in the same manner by a metal track PM straddling the insulating region RIS, this metal track being connected to the areas ZX1 by means of vias V.

Figure 6:
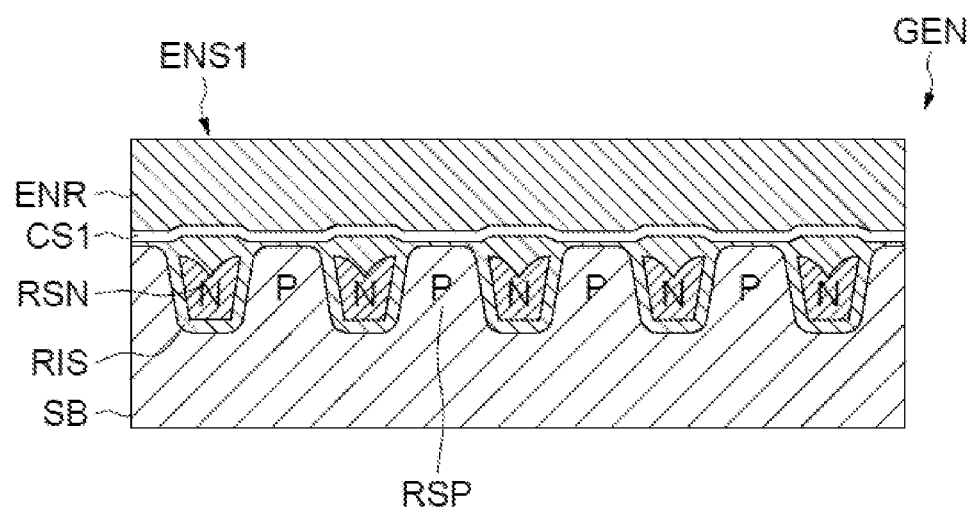

The embodiment in FIG. 6 differs from that in FIG. 4 and in FIG. 5 in the sense that the assembly ENS1 of thermocouples comprises, on the one hand, first parallel semiconductor regions RSP all running in the substrate SB and all having one of the two types of conductivity, in this case the P type of conductivity. Two first neighboring semiconductor regions RSP are separated by an insulating region RIS.

The assembly of thermocouples comprises, on the other hand, second parallel semiconductor regions RSN all respectively running within the insulating regions RIS and all having the other type of conductivity, in this case the N type of conductivity.

It should be noted here that this embodiment has the advantage of offering a generator having, for the same size of surface area as that in FIG. 4, a larger number of PN pairs, which allows the electrical power delivered to be increased.

With respect to a conventional fabrication method of the embedded memory type, the method for fabrication of the generator is slightly modified. More precisely, after formation of the trenches in the silicon, and formation on the walls of the trenches of a layer of oxide coating the latter, the polysilicon is deposited, doped in situ, then the silicon overspilling from the trenches is subsequently etched in a conventional manner, for example, by a dry etching process.

Figure 7:
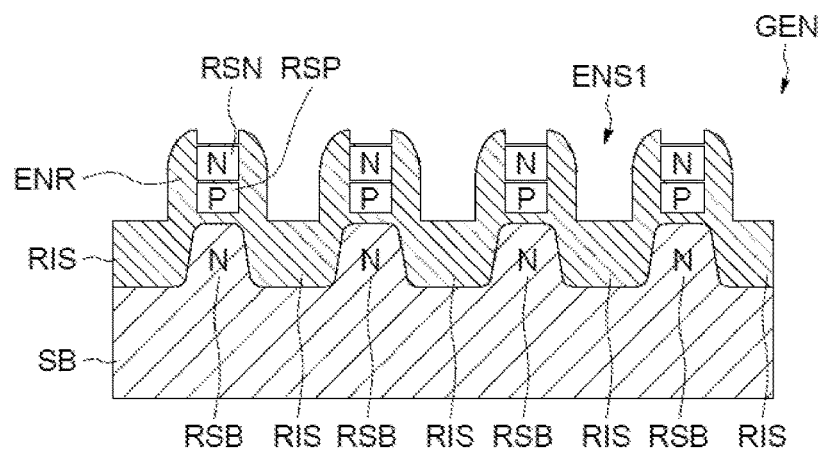
Figure 8:
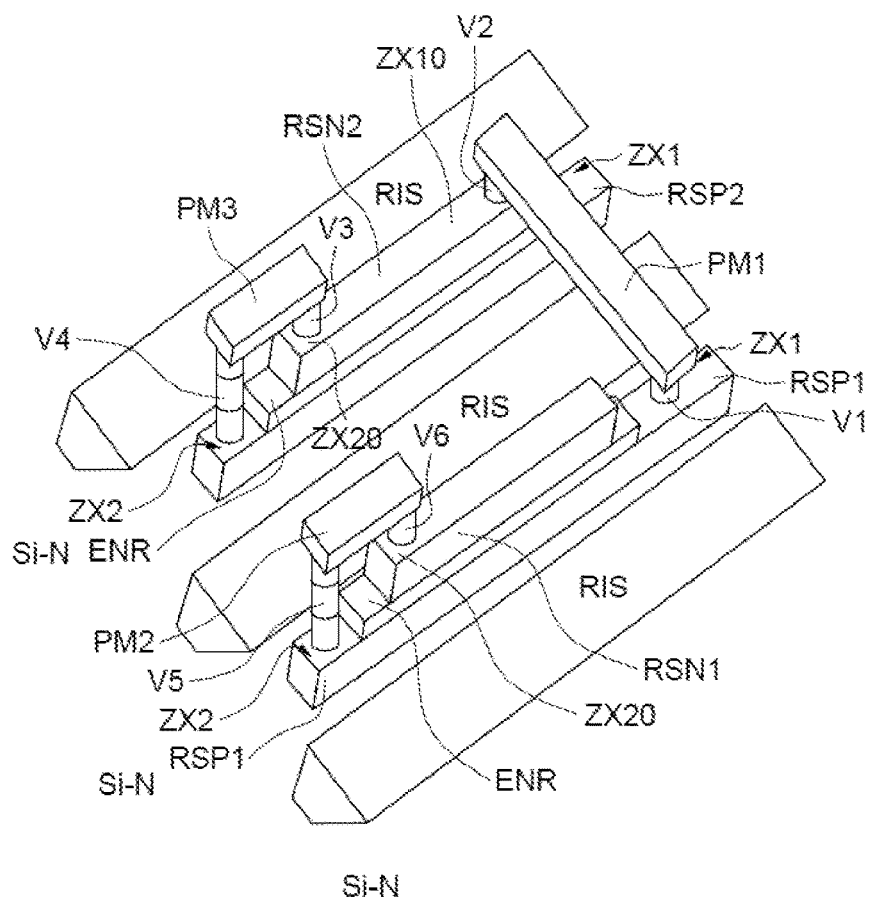

In the embodiment in FIGS. 7 and 8, the region of substrate on which the generator GEN is formed comprises, between the parallel insulating regions RIS, substrate regions RSB all having the same type of conductivity namely here, for example, the N type of conductivity.

In addition, the assembly ENS1 of thermocouples here comprises, on top of each substrate region RSB, at least one pair of semiconductor regions RSP, RSN coated with an insulating material ENR and respectively having the two types of conductivity.

More precisely, in this example, the lower semiconductor regions RSP of the pairs have the P type of conductivity and are covered by the regions RSN which have the N type of conductivity.

The insulating coating conventionally comprises silicon nitride and silicon dioxide and corresponds to the conventional encapsulation of non-volatile dual-gate memories (one gate of which is floating). For this purpose, the method for fabrication of the thermocouple of the generator GEN in FIG. 7 is analogous to the method for fabrication of a floating-gate plane memory.

Here again, as illustrated in FIG. 8, metal tracks and vias allow the thermocouples to be electrically connected in series. More precisely, a first end area ZX1 of a first semiconductor region RSP1 is connected to the corresponding first end area ZX10 of the semiconductor region RSN2 of the neighboring pair through vias V1 and V2 and a portion of metal track PM1.

Furthermore, the second end areas ZX20 of the regions RSN1 and RSN2 are connected to the second corresponding end areas ZX2 of the regions RSP1 and RSP2 through vias V3, V4, V5, V6 and portions of metal tracks PM2, PM3.

It should be noted here that, just as in the embodiment in FIG. 4, the portion PM1 straddles the insulating region RIS separating the two pairs of semiconductor regions RSP1, RSN1 and RSP2, RSN2.

It would also be possible, as a variant, for the pairs of semiconductor regions to be situated above the insulating regions RIS rather than above the substrate regions.

Figure 9:
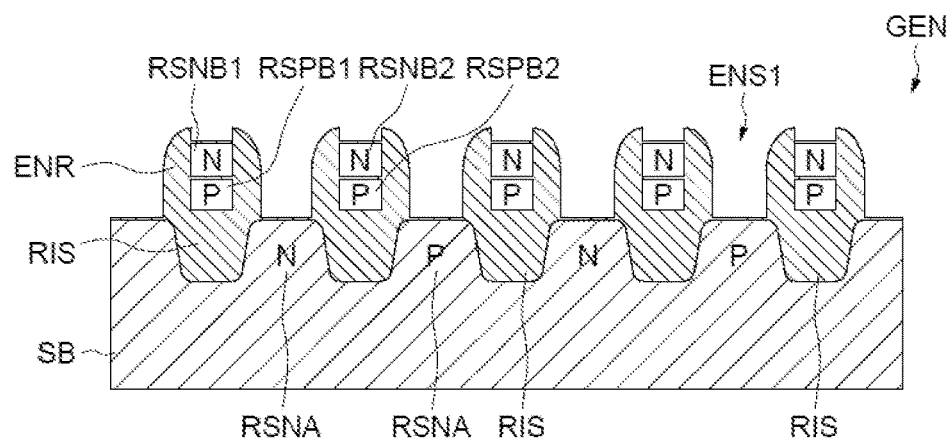

This is notably the case in the embodiment in FIG. 9, in which the assembly ENS1 of thermocouples of the generator GEN furthermore comprises parallel semiconductor regions RSNA, RSPA running in the substrate, and having respectively and alternately one and the other of the two types of conductivity (N and P) while being separated by parallel insulating regions RIS.

In addition, as indicated hereinabove, aside from these substrate regions RSNA, RSPA, the assembly ENS1 comprises, on top of each insulating region, a pair of semiconductor regions RSPBi and RSNBi coated with an insulating material ENR and respectively having the two types of conductivity N and P.

Thus, with respect to the embodiment in FIG. 7, and for the same size of surface area, the generator GEN in FIG. 9 has an increased number of PN pairs with respect to the number of PN pairs of the generator in FIG. 7.

Here again, the generator in FIG. 9 is perfectly compatible with methods for fabrication of embedded non-volatile memories.

Figure 10:
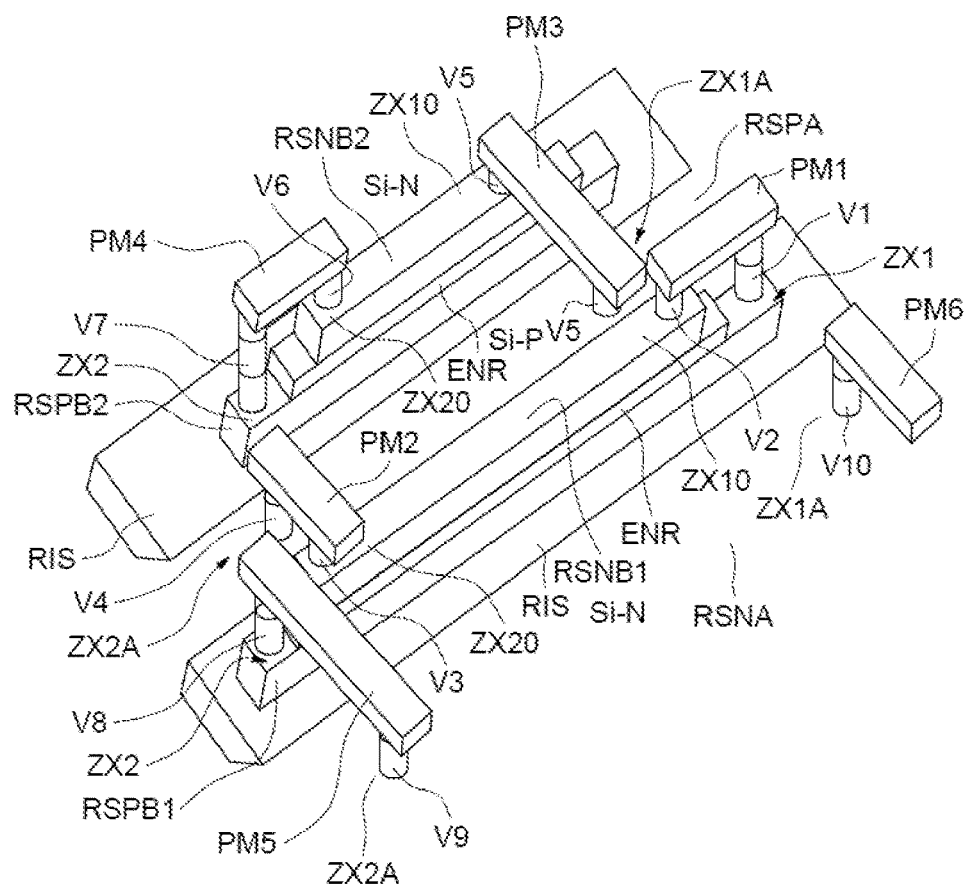

The electrical link means between the various elements of the various thermocouples are illustrated schematically in FIG. 10.

More precisely, a first end area ZX1 of the semiconductor region RSPB1 situated on top of the insulating region RIS is connected to the first corresponding end area ZX10 of the region RSNB1 through vias V1 and V2 and a portion of metal lines PM1.

The second end area ZX20 of the region RNSB1 is connected to the second end area ZX2A of the substrate region RSPA through vias V3 and V4 and a portion of metal track PM2.

The electrical continuity between the region RSPA and the region RSNB2 is provided by vias V5 and a portion of metal track PM3 connecting the two corresponding first end areas ZX1A and ZX10 of the region RSPA and of the region RSNB2.

The electrical continuity between the regions RSNB2 and RSPB2 is provided by vias V6 and V7 and a portion of metal track PM4 connecting the two corresponding ends ZX20 and ZX2 of these two regions.

The electrical continuity between the region RSPB1 and the neighboring substrate region RSNA is provided, at their respective second end areas ZX2 and ZX2A, by vias V8 and V9 and a portion of metal track PM5.

Similarly, the electrical continuity between this region RSNA and the semiconductor region RSPB of the neighboring pair is provided by a via V10 and a portion of metal track PM6 on the end area ZX1A of the region RSNA.

Figure 11:
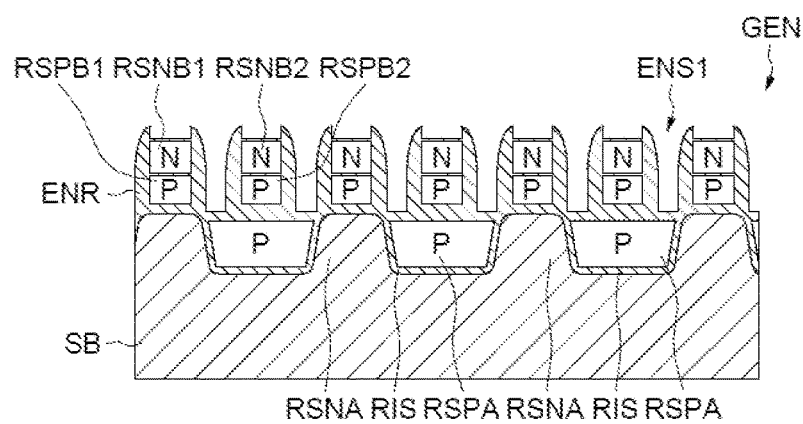

The embodiment of the generator GEN in FIG. 11 differs from that in FIG. 9 by the fact that the assembly ENS1 of thermocouples furthermore comprises parallel semiconductor regions running within the insulating regions RIS.

More precisely, the assembly ENS1 of thermocouples comprises parallel substrate regions RSNA all having the same type of conductivity, in this case the N type of conductivity, semiconductor regions RSPA running within the insulating regions RIS separating these substrate regions RSNA and all having the other type of conductivity, namely the P type of conductivity, and, on top of each substrate region RSNA, pairs of parallel semiconductor regions RSPBi and RSNBi coated with an insulating material ENR.

Thus, such an embodiment, perfectly compatible with the technology of embedded non-volatile memories, comprises, with respect to the embodiment in FIG. 4, a much higher number of PN pairs for the same surface footprint, which makes it much more efficient in terms of electrical power produced.

Figure 12:
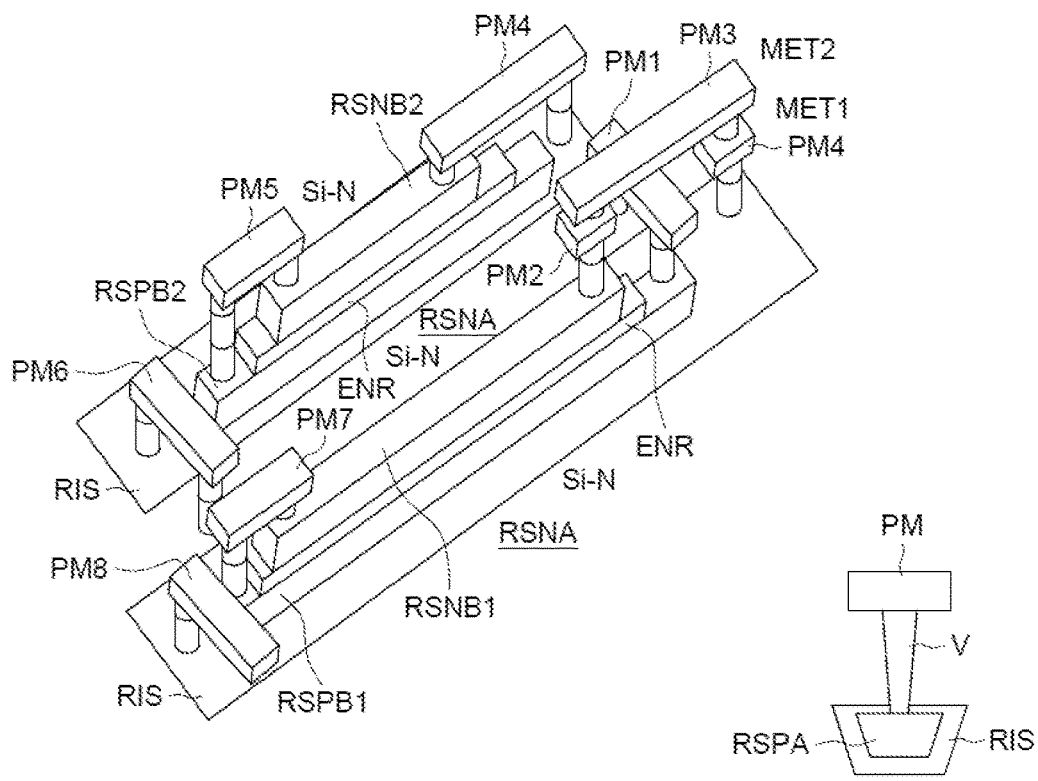

The electrical connection means between the various parts of the various thermocouples of the generator in FIG. 11 are illustrated schematically in FIG. 12. This time, some of these means run simultaneously over two metallization levels of the integrated circuit, namely the metallization level 1 MET1 and the metallization level 2 MET2.

Just as in the preceding embodiments, the electrical continuity between the various elements of the various thermocouples connected in series is effected through vias and portions of metal track connecting two end areas of two semiconductor regions having the two opposing types of conductivity N and P.

In addition, whereas the electrical connection between the region RSPB1 and the region RSNA is effected by a portion of metal track PM1 situated on the metallization level MET1, the electrical connection between the region RSNB1 and the region RSPA, encapsulated within the insulating region RIS, is effected notably by three portions of metal tracks PM2, PM3, PM4 situated on the metallization levels MET1 and MET2.

The lower right-hand part of FIG. 12 shows the connection between a portion of metal track PM and a semiconductor region RSPA, encapsulated within a region RIS, by means of a via V passing through the region RIS in order to come into contact with the region RSPA.

The other electrical continuities of the regions illustrated in FIG. 12 notably comprise portions of metal track PM4, PM5, PM6, PM7, PM8.

Figure 13:
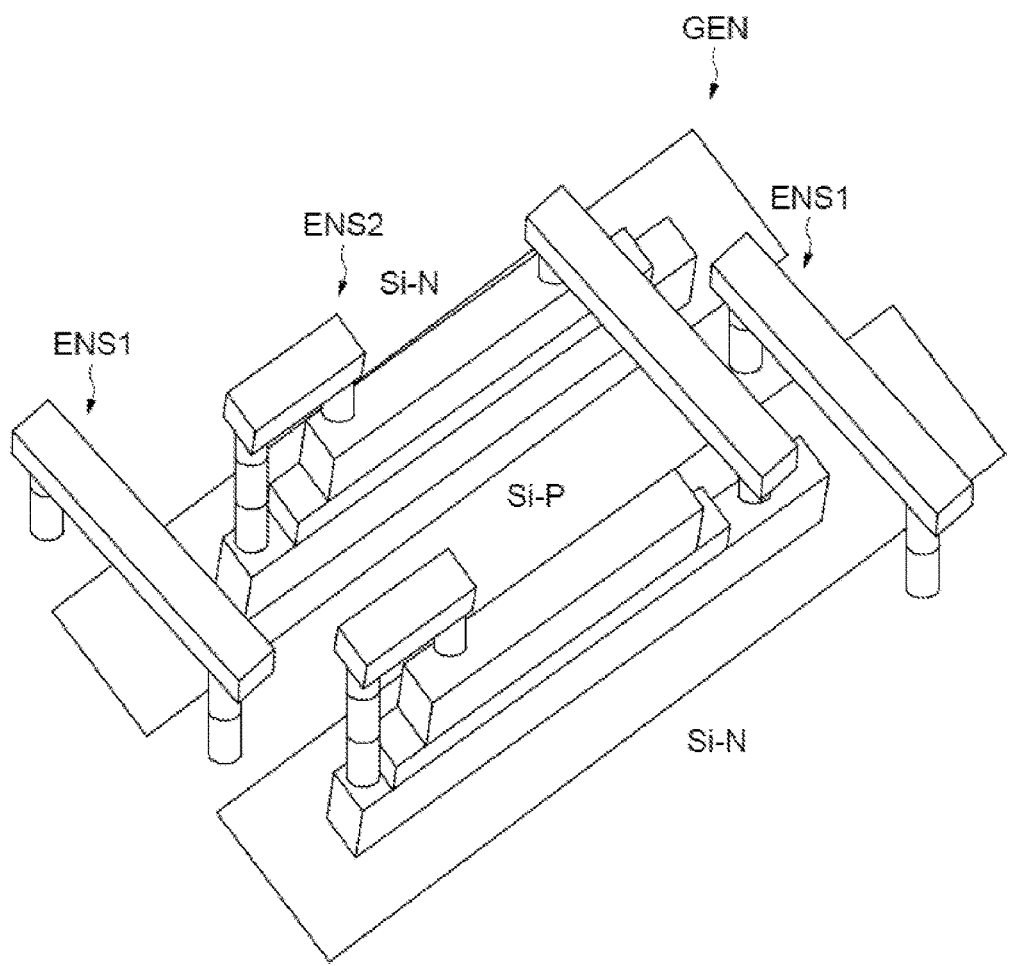

As was indicated hereinabove with reference to FIG. 3, two assemblies of thermocouples may be electrically connected in parallel. One example of such an embodiment is illustrated in FIG. 13.

In this figure, the generator GEN comprises for example the assembly of thermocouples ENS1 illustrated in FIGS. 4 and 5, and the assembly of thermocouples ENS2 illustrated in FIGS. 7 and 8.

Silicon is a very good conductor of heat, such that the two levels of temperature respectively present at the two ends of the thermocouples, and initially different, can equalize very quickly, which then halts the generation of electrical power.

Figure 14:
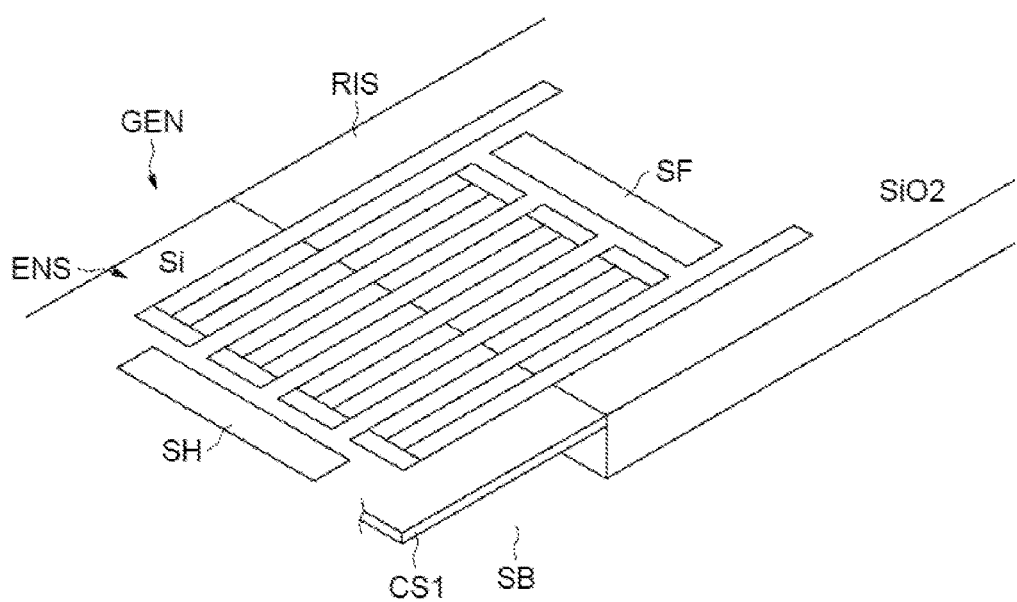

Generally speaking, the embodiment in FIG. 14 allows, notably by the use of polysilicon, the equilibrium of the temperatures to be delayed, while at the same time remaining compatible with conventional CMOS fabrication technologies.

More precisely, as illustrated very schematically in FIG. 14, part of the assembly of thermocouples ENS of the generator GEN runs over a part of the substrate SB covered by an insulating layer CS1, for example, a thin layer of silicon dioxide, whereas the other part of the assembly of thermocouples runs over an insulating region RIS, thicker than the insulating layer covering the silicon substrate, where this layer RIS can be a shallow insulating trench of the STI type.

For this reason, in view of the fact that the insulating material, generally silicon dioxide, is a very poor conductor of heat, attaining equilibrium of the temperatures between the two ends of the thermocouples is delayed, which improves the efficiency of the generator.

Figure 15:
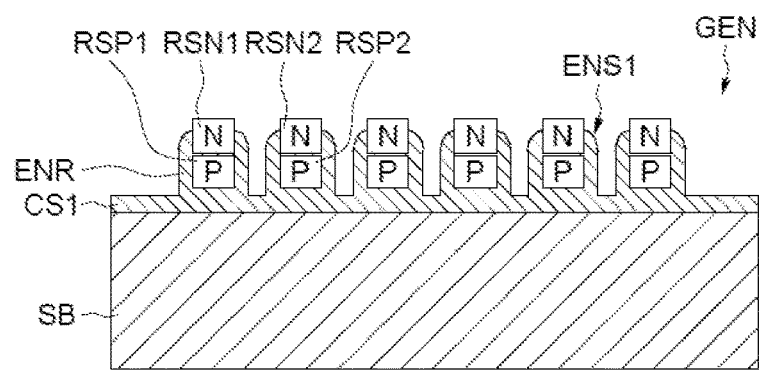
Figure 16:
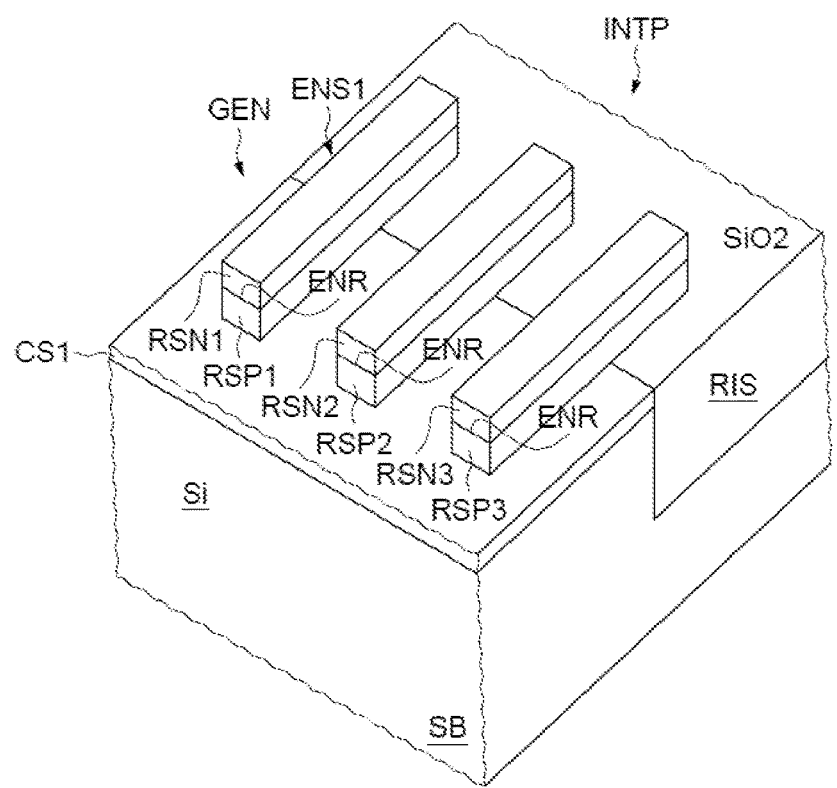

One more precise exemplary embodiment is illustrated in FIGS. 15 and 16.

In these figures, the corresponding region of substrate SB is covered by a thin insulating layer CS1 of silicon dioxide.

The assembly ENS1 of thermocouples comprises several parallel pairs of parallel semiconductor regions RSNi, RSPi respectively having the two types of conductivity N and P, these pairs running over and above the insulating layer CS1 and over the insulating region RIS, thicker than the insulating layer CS1.

What is claimed is:

1. A method for generating electrical power within a three-dimensional integrated structure having a first circuit and a second circuit, the method comprising:
    operating one of the first circuit and the second circuit;
    having the first circuit electrically intercoupled to a link device, the link device comprising a semiconductor substrate and an interconnect overlying the semiconductor substrate;
    operating the first circuit to produce a temperature gradient in a region of the link device; and
    producing electrical power using a thermo-electric generator comprising an assembly of thermocouples electrically coupled in series and thermally coupled in parallel and contained within the region subjected to the temperature gradient, a first end of each thermocouple being positioned at an end area near the first circuit and a second end of each thermocouple being positioned at an end area away from the first circuit and positioned at an end area near the second circuit, wherein the thermo-electric generator is disposed in the link device, the assembly of thermocouples comprising parallel doped semiconductor regions, and a major axis of each doped semiconductor region of the assembly of thermocouples extending in a direction that is parallel to a major surface of the semiconductor substrate.

2. The method according to claim 1, further comprising providing power from the thermo-electric generator to at least one of the first circuit and second circuit.

3. The method according to claim 1, further comprising charging an energy storage device using the electrical power produced using the thermo-electric generator.

4. The method according to claim 3, wherein the energy storage device is a capacitor.

5. The method according to claim 4, wherein the energy storage device is a battery.

6. The method according to claim 1, wherein the link device further comprises insulating regions within the semiconductor substrate, and wherein the parallel doped semiconductor regions are electrically coupled in series so as to form a chain of regions alternately between a first conductivity type and a second conductivity type opposite the first conductivity type.

7. A method, comprising:
operating one of a first integrated circuit and a second integrated circuit, the first integrated circuit being disposed on a link device, the operating the first integrated circuit causing a thermal gradient to form in the link device;
in response to the forming of the thermal gradient in the link device, generating, by a plurality of thermocouples of a thermo-electric generator, an electrical current, wherein the plurality of thermocouples are electrically coupled in series and thermally coupled in parallel and contained within a region of the link device that is subjected to the thermal gradient, a first end of each thermocouple is positioned at an end area near the first integrated circuit and a second end of each thermocouple is positioned at an end area away from the first integrated circuit and positioned at an end area near the second integrated circuit, the plurality of thermocouples comprises parallel doped semiconductor regions disposed in a semiconductor substrate of the link device, and a major axis of each semiconductor region of the parallel doped semiconductor regions extends in a direction that is parallel to a major surface of the semiconductor substrate; and
supplying the electrical current to a device.

8. The method according to claim 7, wherein the electrical current is used to charge a battery.

9. The method according to claim 7, wherein the link device comprises an interconnect region disposed over the semiconductor substrate, and wherein the parallel doped semiconductor regions are electrically coupled in series so as to form a chain of regions alternately between a first conductivity type and a second conductivity type opposite the first conductivity type.

10. The method according to claim 9, wherein the parallel doped semiconductor regions being electrically coupled in series comprises the parallel doped semiconductor regions being electrically coupled in series by vias and one or more metal tracks, the one or more metal tracks extending in a first level of metallization of a plurality of levels of metallization of the interconnect region.

11. The method according to claim 9, wherein one or more thermocouples of the plurality of thermocouples are disposed above the semiconductor substrate.

12. The method according to claim 9, wherein the first integrated circuit is thermally coupled to the plurality of thermocouples.

13. The method according to claim 9, wherein the plurality of thermocouples is partially disposed on and contacting a first material having a first type and partially disposed on and contacting a second material having a second type.

14. The method according to claim 7, wherein the first integrated circuit is disposed over the link device, the second integrated circuit is disposed over the link device, and the region of the link device that is subjected to the thermal gradient is laterally disposed between the first integrated circuit and the second integrated circuit.

15. A method, comprising:
having a first circuit and a second circuit packaged and bonded to a link device via bumps;
operating a first circuit to produce heat in a region of the link device, wherein a thermocouple assembly is disposed in the region of the link device, and the producing the heat creates a thermal gradient across the thermocouple assembly, wherein the circuit is disposed over the link device, the link device comprises an interconnect and a semiconductor substrate, the thermocouple assembly comprises a plurality of parallel doped semiconductor regions disposed in the semiconductor substrate, a major axis of each semiconductor region of the parallel doped semiconductor regions extends in a direction that is parallel to a surface of the semiconductor substrate, and adjacent semiconductor regions of the parallel doped semiconductor regions are electrically coupled in series and thermally coupled in parallel so as to form a chain of semiconductor regions alternating between a first conductivity type and a second conductivity type opposite to the first conductivity type, a first end of each doped semiconductor region is positioned at an end area near the circuit and a second end of each doped semiconductor region is positioned at an end area away from the circuit and positioned at an end area near the second circuit; and
creating an electrical current by the thermocouple assembly in response to the creation of the thermal gradient.

16. The method according to claim 15, wherein semiconductor regions of the plurality of parallel doped semiconductor regions that are disposed in the semiconductor substrate are respectively separated from adjacent semiconductor regions by insulating regions in the semiconductor substrate.

17. The method according to claim 15, wherein a plurality of thermocouples of the thermocouple assembly are disposed above the semiconductor substrate.

18. The method according to claim 15, wherein the adjacent semiconductor regions of the parallel doped semiconductor regions being electrically coupled in series comprises the adjacent semiconductor regions being electrically coupled in series by vias and one or more metal tracks, the one or more metal tracks extending in a first level of metallization of a plurality of levels of metallization of the interconnect.

19. The method of claim 1, wherein a Peltier effect is active from the end area near the first circuit to the end area near the second circuit.

20. The method of claim 15, wherein a Peltier effect is active in the direction that is parallel to the major surface of the semiconductor substrate.

* * * * *